(12) United States Patent
Liu et al.

(10) Patent No.: US 7,906,426 B2
(45) Date of Patent: Mar. 15, 2011

(54) METHOD OF CONTROLLED LOW-K VIA ETCH FOR CU INTERCONNECTIONS

(75) Inventors: Wuping Liu, Singapore (SG); Johnny Widodo, Singapore (SG); Teck Jung Tang, Johor (MY); Jing Hui Li, Chongqing (CN); Han Wah Ng, Johor (MY); Larry A. Clevenger, LaGrangeville, NY (US); Hermann Wendt, Poughkeepsie, NY (US)

(73) Assignees: Globalfoundries Singapore Pte. Ltd., Singapore (SG); International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 416 days.

(21) Appl. No.: 11/788,969

(22) Filed: Apr. 23, 2007

(65) Prior Publication Data

US 2008/0258308 A1 Oct. 23, 2008

(51) Int. Cl.
*H01L 21/4763* (2006.01)
(52) U.S. Cl. .. 438/618; 438/637; 438/704; 257/E23.145
(58) Field of Classification Search .................. 438/618, 438/637, 638, 704; 257/E23.145
See application file for complete search history.

(56) References Cited

U.S. PATENT DOCUMENTS

| | | | |
|---|---|---|---|
| 2004/0017011 A1* | 1/2004 | Narita et al. | 257/762 |
| 2005/0079705 A1* | 4/2005 | Takeuchi | 438/637 |
| 2005/0124149 A1* | 6/2005 | Kim et al. | 438/618 |
| 2006/0121721 A1* | 6/2006 | Lee et al. | 438/618 |
| 2006/0252256 A1* | 11/2006 | Weng et al. | 438/637 |
| 2006/0292856 A1* | 12/2006 | Park et al. | 438/622 |
| 2007/0020944 A1* | 1/2007 | Chae et al. | 438/725 |

* cited by examiner

*Primary Examiner* — Asok K Sarkar
*Assistant Examiner* — Julia Slutsker
(74) *Attorney, Agent, or Firm* — Katten Muchin Rosenman LLP

(57) ABSTRACT

An interconnect stack and a method of manufacturing the same wherein the interconnect has vertical sidewall vias. The interconnect stack includes a substrate, a metal interconnect formed in the substrate, an etch stop formed on the substrate and the metal interconnect, and an interlayer dielectric (ILD) layer having at least one via formed therein extending through a transition layer formed on the etch stop layer. The via is formed by etching the ILD to a first depth and ashing the interconnect stack to modify a portion of the ILD between the portion of the via formed by etching and the transition layer. Ashing converts this portion of the ILD to an oxide material. The method includes wet etching the interconnect to remove the oxide material and a portion of the transition layer to form a via extending through the ILD to the etch stop layer.

17 Claims, 4 Drawing Sheets

METHOD OF CONTROLLED LOW-K VIA ETCH FOR CU INTERCONNECTIONS

BACKGROUND OF THE INVENTION

1. Field of the Invention

The invention relates generally to methods for the fabrication of integrated circuit devices and particularly to the controlled etch of vias in dielectric layers to form vias having straight sidewalls.

2. Discussion of the Prior Art

Computing technology has revolutionized the way people work and play and has contributed enormously to the advancement of humankind. Much of computing technology has been enabled by the discovery and advancement of semiconductor processing technology.

In the field of integrated circuit manufacturing, a fundamental goal is to design and manufacture integrated circuits to be as small as possible. As is well known in this art, the manufacturing cost of an integrated circuit corresponds strongly to the wafer area occupied by each integrated circuit die or chip. This is because the chip area correlates directly to the number of possible integrated circuits per manufactured wafer, and because the theoretical yield, for a given manufacturing defect density, increases as chip area decreases. In addition, the smaller feature sizes that result in decreasing chip area also provide improved device performance and increased functionality per unit area.

FIG. 1 shows a portion of an interconnect stack 10 before any etching has taken place but following litho-patterning as is known in the art. The interconnect stack 10 includes a substrate 12 which may be an interlayer dielectric (ILD) layer having Cu interconnects 16 formed therein. An etch stop layer 18 is formed over the substrate 12 and the Cu interconnects 16 and acts as a capping layer for the substrate 12 and Cu interconnects 16. FIG. 1 shows an oxide-like transition layer 24 formed over the etch stop layer 18. The oxide-like transition layer 24 promotes adhesion of the capping layer or etch stop 18, and an interlayer dielectric (ILD) 14 formed over the oxide-like transition layer 24. The use of the oxide-like transition layer is particularly useful when the ILD layer is formed of low-k or ultra low-k material. A hardmask 22 is formed on a second ILD layer 14. Finally, a photoresist 20 is formed on the hardmask 22.

The ILD layer 14 is preferably low or ultra low-k dielectric layers formed by chemical vapor deposition (CVD). The etch stop layer 18 prevents diffusion of Cu into the ILD 14 from the Cu interconnect as well as preventing diffusion to neighboring metal lines. For 90 nm via width and smaller technologies which use CVD low-k ILD, the etch stop layer 18 may be, for example, SiCN formed of either C-doped SiN or N-doped SiC, though other materials may also be used. The oxide-like transition layer is not necessary for all interconnects 10, but as will be explained below, is common for technologies using low-k or ultra low-k ILD layers.

Due to its relatively high k-value as compared to the ILD layer 14, the etch stop layer 18 is generally formed at less than 500 Å, and usually within the range of 250-400 Å, but technological development continues to reduce the low end of this range. One problem associated with the etch stop layer 18 is that, particularly when used in combination with low-k and lower-k CVD deposited ILD layers, it has poor etch selectivity. That is, it is difficult to critically control the etch process. Typical etch procedures use for example carbon-fluorine ($C_xF_x$) organic chemistries in varying concentrations to perform the etch process in a step-wise fashion. Often such an organic etch chemistry will have a higher $C_xF_x$ concentrations in initial etching and have a lower concentration, producing less reactivity, for the subsequent etching steps, resulting in greater selectivity. Because such thin films of SiCN provide poor etch selectivity properties with respect to low-k or ultra low-k ILD layers, its use can lead to etch stop layer breakthrough during etching and/or over etch during the etching process. Because the via walls become tapered during these process steps, other problems can result such as high via resistance, large via resistance variation between successive vias, and ultimately via failure. During the etching process the $C_xF_x$ etching materials are absorbed into the porous ILD layers, as a result during subsequent ashing procedures using oxygenated ashing materials, the residual $C_xF_x$ is released causing further detrimental etching. Often this additional etching during the ashing process results in the formation of a taper at the bottom of the via 26 in the etch stop layer 18. This etching caused by the release of $C_xF_x$ from the ILD layer is called the "Memory Effect."

The use of ultra low-k ILD layers ($k \leqq 2.5$), for example in new technology such as 45 nm Back-End-of-Line (BEOL) platforms, where for example the gate width is a mere 45 nm, creates new issues to overcome. An ultra low-k ILD layer 14 does not adhere well to the SiCN due to chemistry differences (organic vs. inorganic) and the fact that ultra low-k ILD is porous, thus reducing the surface area for adequate adhesion. Because an ultra low-k ILD layer 14 does not adhere well to the SiCN etch stop layer 18, an oxide-like transition layer 24 is used between the etch stop and the ILD layer 14 to promote adhesion and structural integrity. While the oxide-like transition layer 24 promotes good adhesion, it exacerbates the problems with etching and etch process selectivity and the formation of tapering at the bottom of the vias. This is demonstrated in FIGS. 2a and 2b.

The oxide-like transition layer 24 has a different etch rate than the SiCN etch stop layer 18 and the ILD layer 14. It is normally etches slower that the ILD layer 14. This slower etching makes the tapering experienced at the bottom of the via 26 worse than if the transition layer 24 were not there. Further, as can be seen by the comparison of FIGS. 2a and 2b, following subsequent resist stripping via the ashing process, again residual $C_xF_x$ causes further memory effect etching, and actually increases the taper problems experienced. As discussed above, this tapering results in high via resistance, large via resistance variation between successive vias, and ultimately via failure.

Accordingly, there is a need for an integrated circuit having straight sided vias, to increase the uniformity of the via resistance, particularly in devices using ultra low-k ILD layers requiring the use of an oxide like transition layer for proper adhesion of the ILD, Cu interconnect, and the SiCN etch stop layer. The present invention is directed to providing such a method and circuit.

SUMMARY OF THE INVENTION

One aspect of the present invention is a method for the formation of straight sidewall vias including a step of providing an interconnect stack having a substrate, at least one metal interconnect formed therein, an etch stop layer, a transition layer, an interlayer dielectric (ILD) layer and a photoresist. The method follows with a step of etching the ILD layer to a predetermined point to form a via having a first depth. Subsequent steps include ashing the interconnect stack to convert the remaining ILD layer in the via to an oxide-like material, and wet etching the via through the transition layer, wherein the etch stop layer remains substantially unaffected and the sidewalls of via are straight.

Another aspect of the present invention is directed to an interconnect stack having vertical sidewall vias including a substrate, a metal interconnect formed in the substrate, an etch stop formed on the substrate and the metal interconnect, and an interlayer dielectric (ILD) layer having at least one via formed therein extending through a transition layer formed on the etch stop layer. The via is formed by etching the ILD to a first depth, ashing the interconnect stack to modify a portion of the ILD between the portion of the via formed by etching and the transition layer, converting this portion of the ILD to an oxide material, and then wet etching the interconnect to remove the oxide material and a portion of the transition layer to form a via extending through the ILD to the etch stop layer.

BRIEF DESCRIPTION OF THE DRAWINGS

For a more complete understanding of the present invention, and the advantages thereof, reference is now made to the following description in conjunction with the accompanying drawings, in which.

DETAILED DESCRIPTION

Figure 3:
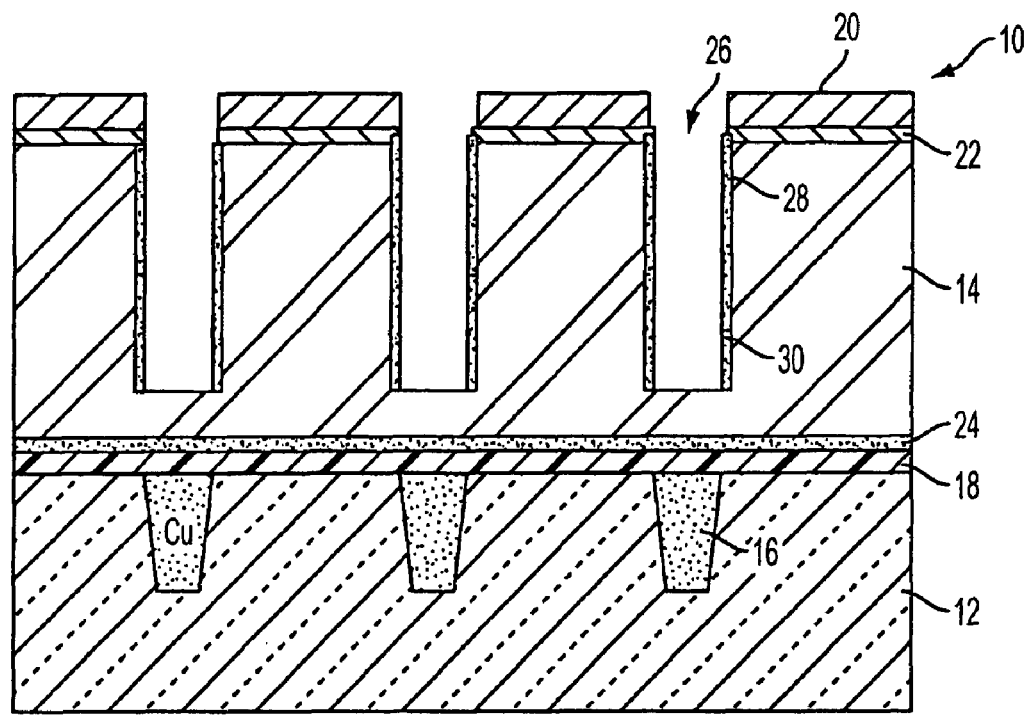
FIG. 3—is a cross-sectional view of interconnect stack according to one aspect of the present invention, following an etching step.
Figure 4:
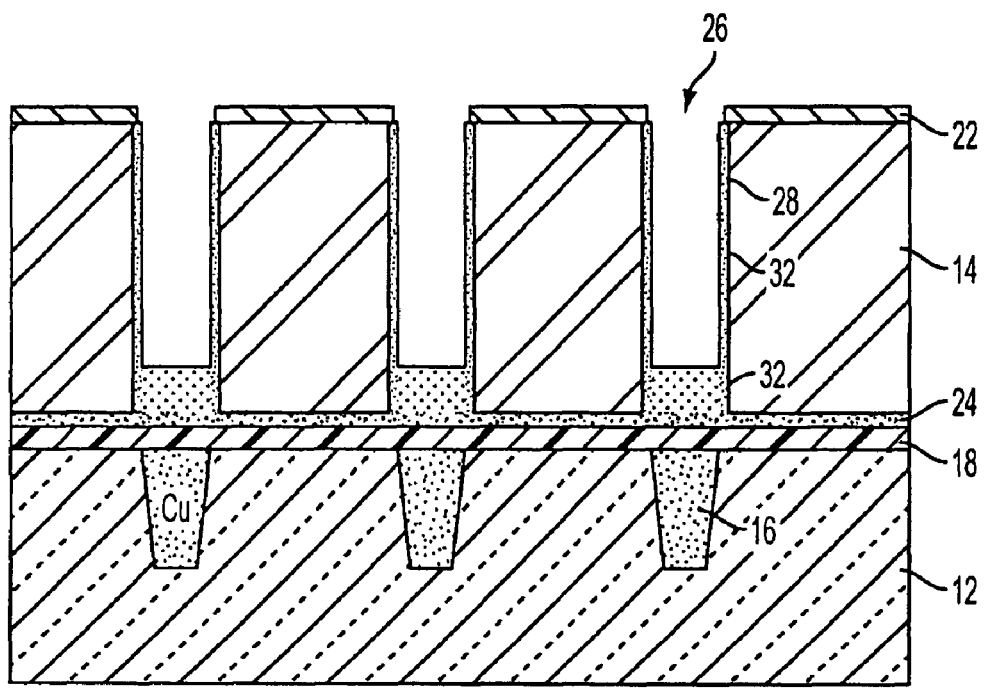
FIG. 4—is a cross-sectional view of an interconnect stack according to one aspect of the present invention, following an ashing step.

The present invention will now be described with reference to FIGS. 3-5, in which like number will be used to denote like elements, where possible.

Figure 1:
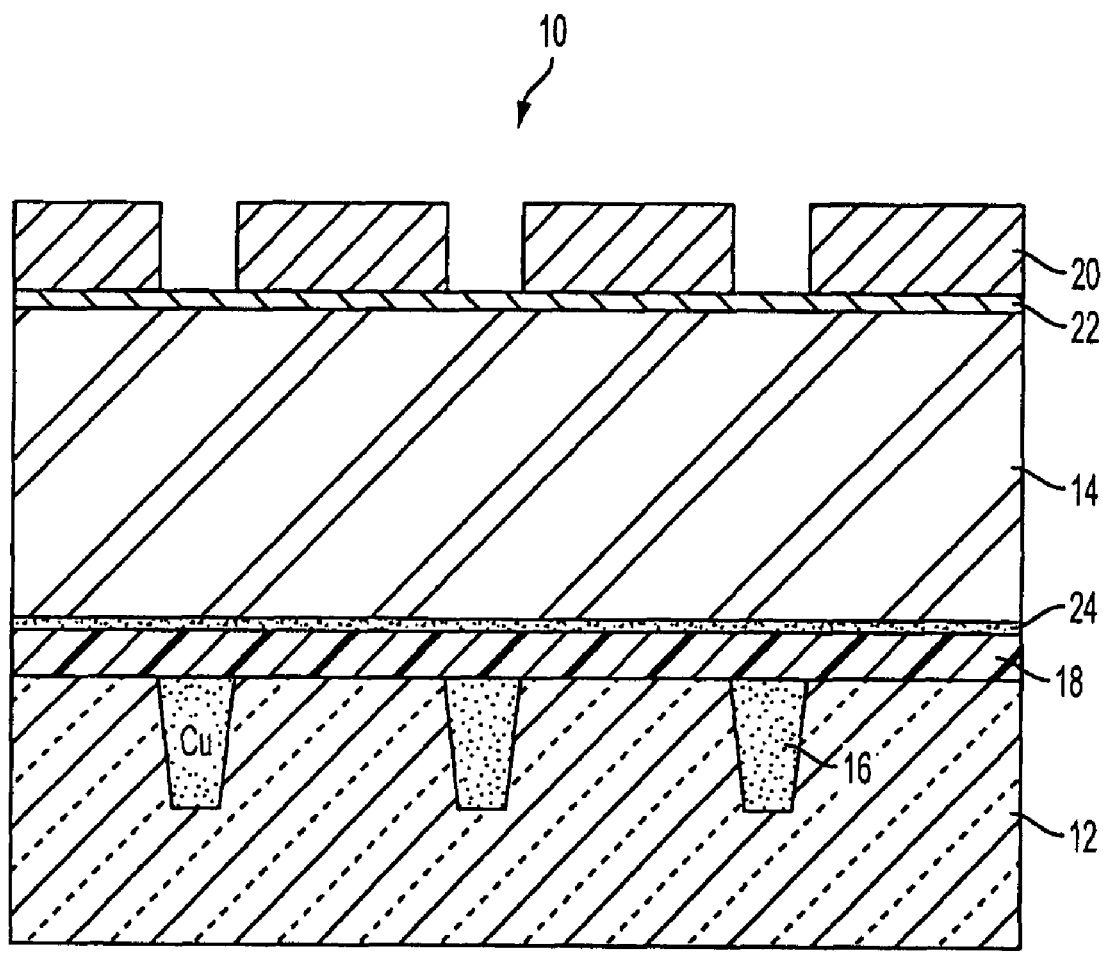
FIG. 1—is a cross-sectional view of an interconnect stack, prior to etching.
Figure 2A:
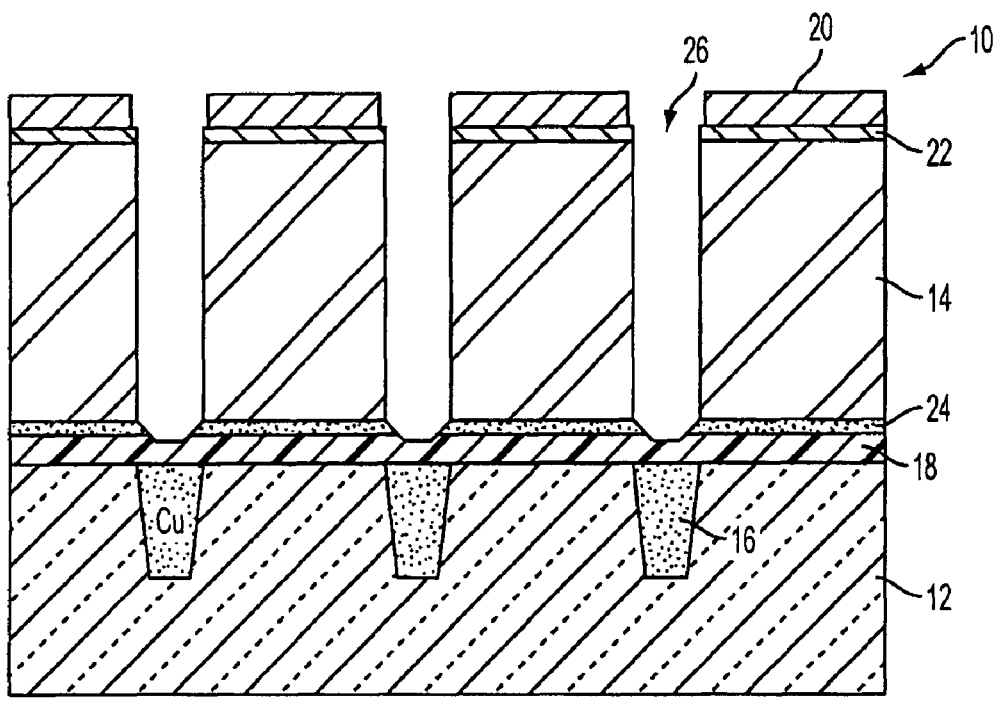
FIG. 2a—is a cross-sectional view of the interconnect stack of FIG. 1 following etching by a prior art method.
Figure 2B:
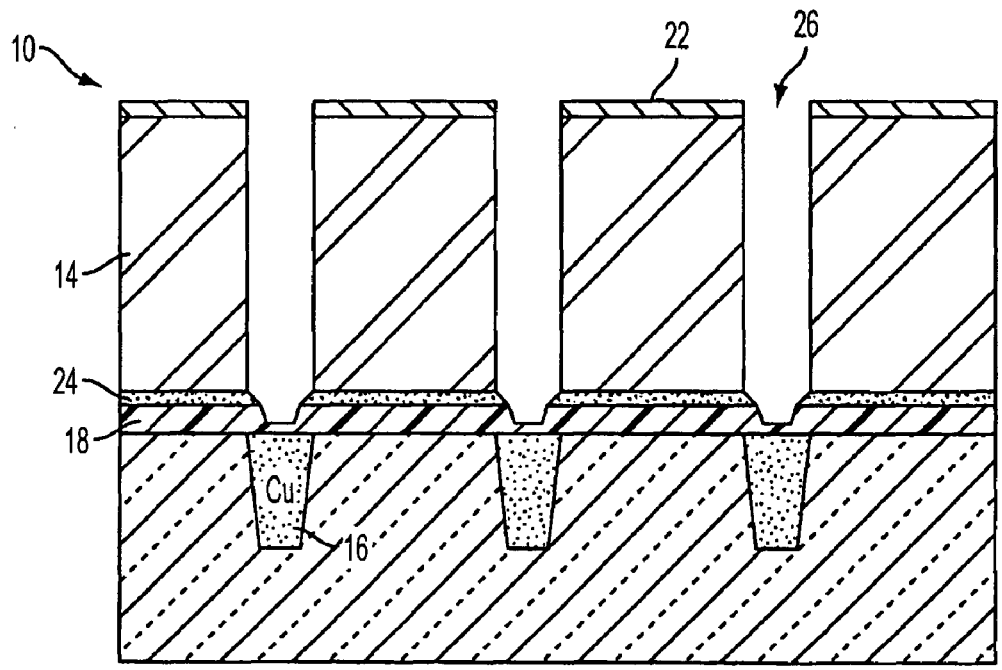
FIG. 2b—is a cross-sectional view of the interconnect stack of FIG. 2a following ashing resulting in undesirable tapering.

The interconnect stack 10 of FIG. 1 is utilized in the method of the present invention to form an interconnect stack 10 having straight via sidewalls. The first step of forming the interconnect stack 10 with straight sidewall 28 vias 26, is to conduct an etching process using a $C_xF_x$ etching material, as known in the art, and shown in FIG. 3. However, unlike prior methods where the etching is continued step-wise until reaching the etch stop layer 18, according to the present invention, the etching is stopped before even reaching the oxide-like transition layer 24. This is done preferably by timing control, however, it may also be accomplished through optical analysis. The use of $C_xF_x$ etching materials causes the formation of a polymer 30 on the sidewalls 28. Specific $C_xF_x$ etching material chemistries can be used as known to those of skill in the art to promote or reduce the amount of polymer formed on the sidewalls 28 in the via 26. The etching process yields straight sidewalls 28, for this portion of the via 26.

After etching, the interconnect stack is subjected to ashing, through known processes using oxygenated ashing materials having an oxygen component including but not limited to additives such as $O_2$, CO and $CO_2$. The result of the ashing process is shown in FIG. 4. The ashing process using oxygenated ashing materials substantially removes the polymer 30 formed on the sidewalls 28 of the via 26. Further, the memory effect continues some of the etching process on the sidewalls and will effect the portion of the ILD 14 remaining at the bottom of the via 26. That is, the use of the oxygenated ashing materials releases residual $C_xF_x$ that is entrained in the porous ILD layer 14 causing further etching of the sidewalls 26 and a portion but not all of the ILD layer 14 at the bottom of the via 26. However, the memory effect does not damage the etch stop layer 18 or the oxide-like transition layer 24, as in the known processes. Other than possible residual etching via the memory effect, the ashing process itself, using the oxygenated material, does not have effect on the oxide-like transition layer 24. Thus the portion of the ILD 14 remaining in the bottom of the via 26 prevents any of the, residual etching caused by the memory effect from reaching the oxide-like transition layer 24 or the etch stop layer 18.

The portion of the ILD 14 which has not been etched away at the bottom of the via 26 and any portions of the polymer 30 remaining on the sidewalls 28 are modified by the ashing process to form an oxide-like layer 32, as the carbon contained therein is depleted. In addition, the ashing may form a superficial oxide-like layer (not shown) on the sidewall 28. Again, the ashing step is preferably controlled by timing control, however, it may also be accomplished through optical analysis.

Because the oxide-like transition layer 24 and etch stop layers 18 are protected by the ILD layer not etched during the etching process, and are further protected from the memory effect etching caused by the release of the residual $C_xF_x$ in the ILD layer 14 during ashing, these layers do not have tapers formed in them. Incidentally, the ashing process as usual, also known as anisotropic resist stripping, also removes the photoresist layer 20.

Figure 5:
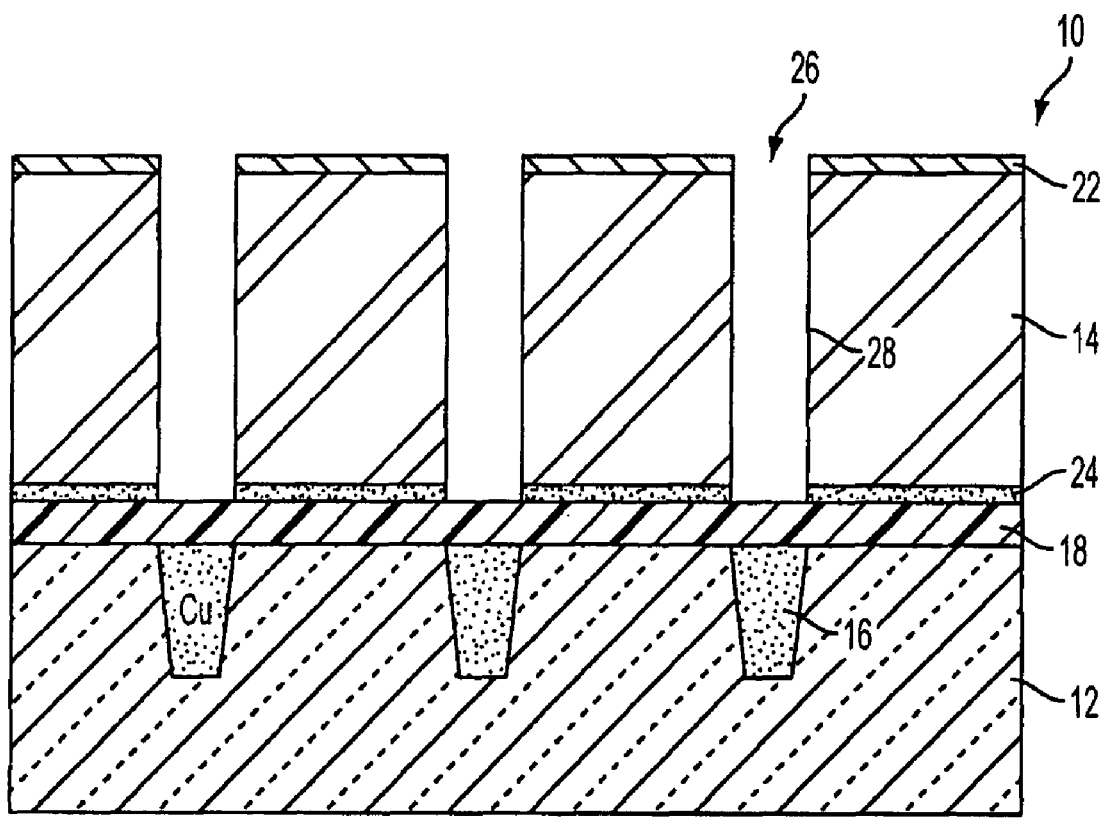
FIG. 5—is a cross-sectional view of an interconnect stack according to one aspect of the present invention, following a wet chemical etch step.

Next in FIG. 5, the interconnect stack 10 is subjected to a wet-chemical etch using, for example, HF or other fluorine based chemistries which are known to those of skill in this art. The wet etch process removes any of the remaining carbon depleted oxide-like layer 32 as well as the oxide-like transition layer 24, and any superficial oxide layer (not shown) formed on the sidewalls 28, resulting in a via 26 having straight sidewalls extending from the hardmask 22 to the etch stop layer 18 without the formation of tapers.

For further processing of the interconnect stack 10, the etch stop layer 18 is removed using processes known to those of skill in this art for those purposes, and the via may be filled or partially filed with metal conductors to produce an integrated circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A method for the formation of straight sidewall vias comprising the steps of:

providing an interconnect stack having a substrate, at least one metal interconnect formed therein, an etch stop layer, a transition layer, an interlayer dielectric (ILD) layer and a photoresist;

etching a portion of the ILD layer to a predetermined point to form a via having a first depth and an unetched portion of the ILD layer between the first depth and the transition layer;

converting the unetched portion of ILD layer in the via to an oxide-like material by ashing the interconnect stack; and wet etching the via through the transition layer to remove the oxide-like material, wherein the etch stop layer remains substantially unaffected and the sidewalls of the via are straight.

2. The method of claim 1, wherein the etching utilizes a carbon-fluorine species.

3. The method of claim 1, wherein the ashing utilizes an oxygenated material.

4. The method of claim 1, wherein the etching step forms a polymer on the sidewalls of the via in the portion where the ILD layer is etched away.

5. The method of claim 4, wherein the ashing releases residual carbon-fluorine absorbed into the ILD layer during etching.

6. The method of claim 4, wherein the ashing substantially removes the polymer formed on sidewalls of the via.

7. The method of claim 4, wherein the ashing depletes carbon in the unetched portion of the ILD layer.

8. The method of claim 7, wherein the depletion of carbon modifies the unetched portion of the ILD layer into an carbon depleted oxide material.

9. The method of claim 8, wherein the ashing forms a superficial oxide layer on the sidewalls of the via.

10. The method of claim 8, wherein the wet etching removes the superficial oxide layer on the sidewalls, the carbon depleted oxide material, and a portion of the transition layer.

11. The method of claim 10, further comprising a step of removing a portion of the etch stop layer to expose a Cu interconnect.

12. The method of claim 1, wherein the substrate is an ILD layer.

13. The method of claim 1, wherein the etch stop layer is SiCN.

14. The method of claim 13, wherein the SiCN etch stop layer is in the range of 250-500 Å.

15. The method of claim 1, wherein the ashing step utilizes an oxygenated material selected from the group consisting of $O_2$, $CO_2$, and CO.

16. The method of claim 1, wherein the wet etching material is HF.

17. The method of claim 1, wherein the ILD layer has a k value of $\leq 2.5$.

* * * * *